US012740385B2

(12) United States Patent
Wu et al.

(10) Patent No.: US 12,740,385 B2
(45) Date of Patent: Sep. 15, 2026

(54) PACKAGE AND FABRICATION METHOD THEREOF

(71) Applicant: Taiwan Semiconductor Manufacturing Company, Ltd., Hsinchu (TW)

(72) Inventors: Chih-Wei Wu, Yilan County (TW); Ying-Ching Shih, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 904 days.

(21) Appl. No.: 17/886,461

(22) Filed: Aug. 12, 2022

(65) Prior Publication Data

US 2024/0055324 A1 Feb. 15, 2024

(51) Int. Cl.

| | |
|---|---|
| ***H01L 23/48*** | (2006.01) |
| ***H10W 20/20*** | (2026.01) |
| ***H10W 70/05*** | (2026.01) |
| ***H10W 70/685*** | (2026.01) |
| ***H10W 74/01*** | (2026.01) |
| ***H10W 74/10*** | (2026.01) |
| *H10W 90/00* | (2026.01) |

(52) U.S. Cl.

CPC ........... *H10W 20/20* (2026.01); *H10W 70/05* (2026.01); *H10W 70/095* (2026.01); *H10W 70/685* (2026.01); *H10W 74/014* (2026.01); *H10W 74/131* (2026.01); *H10W 90/724* (2026.01)

(58) Field of Classification Search

CPC . H01L 23/481; H01L 21/4857; H01L 21/486; H01L 21/561; H01L 23/3157; H01L 23/49822; H01L 24/16; H01L 2224/16235; H01L 2224/16237; H01L 2221/68368; H01L 23/3128; H01L 23/49816; H01L 2221/68345; H01L 21/6835; H10W 20/20; H10W 70/05; H10W 70/095; H10W 70/685; H10W 74/014; H10W 74/131; H10W 90/724; H10W 74/117; H10W 90/701; H10P 72/7424; H10P 72/7434; H10P 72/74

See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |

(Continued)

*Primary Examiner* — Cuong B Nguyen

(74) *Attorney, Agent, or Firm* — JCIPRNET

(57) ABSTRACT

A package includes a first molding compound layer, a conductive via embedded in the first molding compound layer, a semiconductor device, a redistribution structure and a second molding compound layer. The semiconductor device and the redistribution structure are respectively disposed on opposite sides of the first molding compound layer, wherein the semiconductor device is electrically connected to the redistribution structure through the conductive via. The second molding compound layer is disposed on the first molding compound layer, wherein the semiconductor device is encapsulated by the second molding compound layer.

20 Claims, 19 Drawing Sheets

(56) References Cited

U.S. PATENT DOCUMENTS

| | | | | |
|---|---|---|---|---|
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2019/0051621 | A1* | 2/2019 | Liu | H01L 23/585 |
| 2020/0176384 | A1* | 6/2020 | Wu | H01L 21/6835 |
| 2023/0197679 | A1* | 6/2023 | Ecton | H01L 24/73<br>257/668 |

* cited by examiner

PR1
110
102
100
122

122
110
102
100

PACKAGE AND FABRICATION METHOD THEREOF

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. These smaller electronic components also require smaller packages that occupy less area than previous packages. Thus, new packaging technologies have begun to be developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
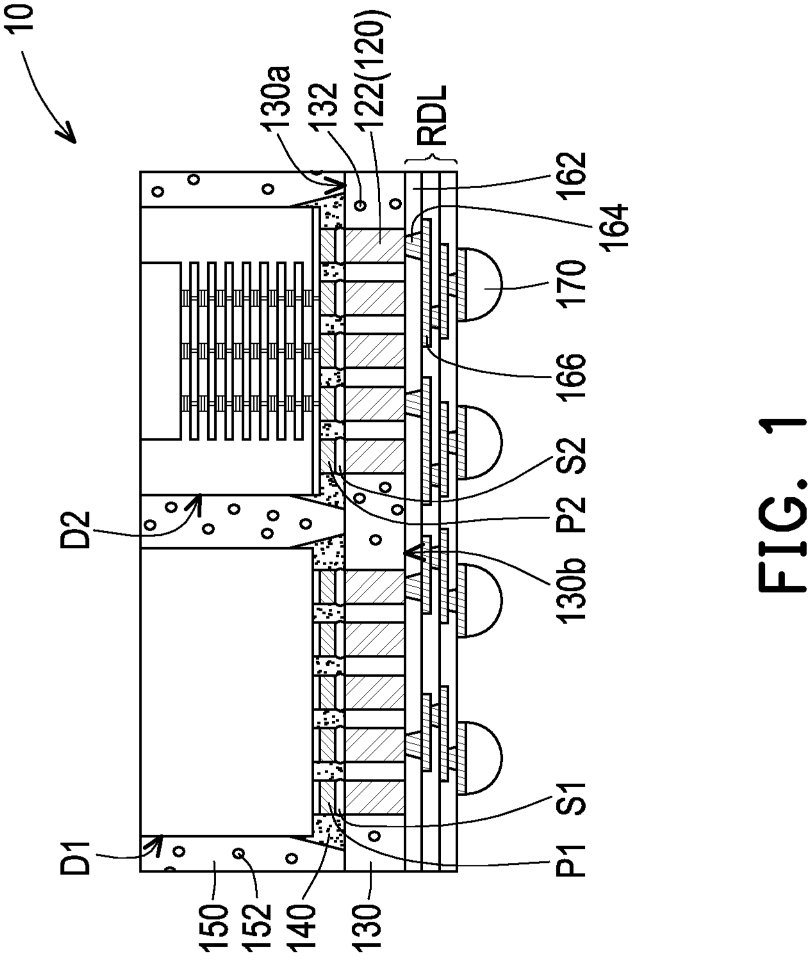
FIG. 1 is a cross-sectional view of the package in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around”, “about”, “approximately”, or “substantially” shall generally mean within 20 percent, or within 10 percent, or within 5 percent of a given value or range. Numerical quantities given herein are approximate, meaning that the term “around”, “about”, “approximately”, or “substantially” can be inferred if not expressly stated.

This disclosure relates to a fabrication method of a package including a first molding compound layer, a semiconductor device and a redistribution structure. The semiconductor device and the redistribution structure respectively disposed on opposite sides of the first molding compound layer. By the first molding compound layer, the problem of delamination during the fabrication process of the package can be improved.

FIG. 1 is a cross-sectional view of the package 10 in accordance with various embodiments of the present disclosure. Referring to FIG. 1, the package 10 includes conductive vias 120, a first molding compound layer 130, underfill structures 140, a second molding compound layer 150, a semiconductor device D1, a semiconductor device D2, a redistribution structure RDL and conductive terminals 170.

The first molding compound layer 130, for example, may include polymers (such as epoxy resins, phenolic resins, silicon-containing resins, or other suitable resins), dielectric materials, or other suitable materials. In an alternative embodiment, the first molding compound layer may include an acceptable insulating encapsulation material. In some embodiments, the first molding compound layer may further include inorganic fillers 132 (e.g., silica, aluminum oxide, clay, and so on) which can be dispersed therein to optimize coefficient of thermal expansion (CTE) and/or the Young’s modulus of the first molding compound layer 130. The disclosure is not limited thereto.

The conductive vias 120 are embedded in the first molding compound layer 130. The conductive vias 120 may have single layer structure or multilayer structure. The conductive vias 120, for example, may include one or more metal layer(s) 122 such as copper, titanium, aluminum, gold, nickel, silver, palladium, a combination thereof or the like. In some embodiments, the conductive vias 120 further includes a metallic seed layer (not shown in FIG. 1). In some embodiments, the metallic seed layer is referred to as a metal layer, which may be a single layer or a composite layer comprising a plurality of sub-layers formed of different materials. In some embodiments, the metallic seed layer includes titanium, copper, molybdenum, tungsten, titanium nitride, titanium tungsten, combinations thereof, or the like. For example, the metallic seed layer may include a titanium layer and a copper layer over the titanium layer.

The semiconductor device D1 and the semiconductor device D2 are disposed on the first side 130*a* of the first molding compound layer 130. The semiconductor device D1 and the semiconductor device D2 are electrically connected to the corresponding conductive vias 120 through die connectors S1, S2, respectively. For example, the first connection structures P1 of the semiconductor device D1 are electrically connected to a part of the conductive vias 120 through the die connectors S1, and the second connection structures P2 of the semiconductor device D2 are electrically connected to another part of the conductive vias 120 through the die connectors S2. The first connection structures P1 and the second connection structures P2 may be conductive pillars. In some embodiments, the die connectors S1 on the first connection structures P1 and the die connectors S2 on the second connection structures P2 may be micro-bumps. When solder is used, the solder may include either eutectic solder or non-eutectic solder. The solder may include lead or be lead-free, and may include Sn—Ag, Sn—Cu, Sn—Ag—Cu, or the like. The die connectors S1, S2 may be formed by a suitable process such as evaporation, electroplating, ball drop, or screen printing.

In this embodiment, the semiconductor device D1 is, for example, a system on a chip (SOC), and the semiconductor device D2 is, for example, a high bandwidth memory (HBM). However, the disclosure is not limited thereto. In other embodiments, the semiconductor devices D1, D2 may be, for example, logic device dies (e.g., accelerated processing unit (APU), graphics processing unit (GPU), piezoelectric multilayer actuator (PMA), piezoelectric actuator (PA), etc.), memory device dies (e.g., low power double-data-rate (LPDDR), flash, dynamic random access memory (DRAM), etc.), or sensor device dies (e.g., contact image sensor (CIS), micro-electro-mechanical system (MEMS), etc.). In some embodiments, the semiconductor devices D1, D2 are designed for mobile applications and may be central computing unit (CPU) dies, power management integrated circuit (PMIC) dies, transceiver (TRX) dies.

The underfill structures 140 may be optionally provided and filled between the semiconductor devices D1, D2 and the first molding compound layer 130 to protect the die connectors S1, S2 against thermal or physical stresses and secure the electrical connection of the semiconductor devices D1, D2 with the conductive vias 120. The underfill structures 140 are surrounding the die connector S1, S2. In some embodiments, a curing process may be performed to consolidate the underfill structures 140. In some embodiments, the underfill structures 140 not only fill up the interstices between the die connectors S1, S2 for securing the connectors S1, S2, but also fill into the gaps between the semiconductor devices D1, D2. In some alternative embodiments, the underfill structures 140 may overflow and extend beyond the semiconductor devices D1, D2, depending on the spacing and relative positions of the semiconductor devices D1, D2 over the first molding compound layer 130.

The second molding compound layer 150 is disposed on the first side 130*a* of the first molding compound layer 130. The semiconductor devices D1, D2 and the underfill structures 140 are encapsulated by the second molding compound layer 150. The underfill structures 140 are disposed on the first side 130*a* of the first molding compound layer 130 and located between the first molding compound layer 130 and the second molding compound layer 150. In some embodiments, the top surfaces of the semiconductor devices D1, D2 is coplanar with the top surface of the second molding compound layer 150. In other embodiments, the second molding compound layer 150 covers the top surfaces of the semiconductor devices D1, D2. In some embodiments, a heat dissipation component (not shown) may be provided on the top surface of the second molding compound layer 150. For example, the heat dissipation component may be in a form of, for example, a stamped metal heat sink, but the disclosure is not limited thereto. In some embodiments, the material of the heat dissipation component may include metal with high thermal conductivity such as copper, aluminum, or the like.

The second molding compound layer 150, for example, may include polymers (such as epoxy resins, phenolic resins, silicon-containing resins, or other suitable resins), dielectric materials, or other suitable materials. In an alternative embodiment, the first molding compound layer may include an acceptable insulating encapsulation material. In some embodiments, the first molding compound layer may further include inorganic fillers 152 (e.g., silica, aluminum oxide, clay, and so on) which can be dispersed therein to optimize coefficient of thermal expansion (CTE) and/or the Young's modulus of the second molding compound layer 150. In some embodiments, the first molding compound layer 130 and the second molding compound layer 150 include the same material or different materials. The disclosure is not limited thereto.

The redistribution structure RDL is disposed on a second side 130*b* of the first molding compound layer 130 opposite to the first side 130*a*. The semiconductor devices D1, D2 are electrically connected to the redistribution structure RDL through the conductive vias 120. The redistribution structure RDL includes a plurality of insulating layers 162 and a plurality of redistribution layers 166 stacked alternately. The number of the insulating layers 162 or the redistribution layers 166 shown in FIG. 1 is merely for illustration, and the disclosure is not limited thereto. The redistribution layers 166 may be electrically connected with each other through the vias 164 embedded in the insulating layers 162. In some embodiments, each of the insulating layers 162 includes polymer such as a photo-sensitive material (e.g., PBO, PI, BCB, a combination thereof or the like). In some embodiments, each of the redistribution layers 166 and the vias 120 includes conductive materials. The conductive materials include metal such as copper, titanium, aluminum, gold, nickel, silver, palladium, a combination thereof or the like, and is formed by an electroplating process. In some embodiments, the redistribution layers 166 respectively includes a seed layer (not shown) and a metal layer formed thereon (not shown). The seed layer may be a metal seed layer such as a copper seed layer. The metal layer may be copper or other suitable metals. In some embodiments, the Young's modulus of the first molding compound layer 130 is larger than the Young's modulus of the insulating layers 162, thereby the warping problem of redistribution structure RDL can be avoided. In some embodiments, the second molding compound layer 150 is formed on the first molding compound layer 130 instead of the redistribution structure RDL, so the probability of cracking of the second molding compound layer 150 can be reduced.

The conductive terminals 170 is disposed in the redistribution structure RDL. The semiconductor devices D1, D2 are electrically connected to the conductive terminals 170 through the conductive vias 120 and the redistribution structure RDL. In some embodiments, the conductive terminals 170 may be ball grid array (BGA) connectors, solder balls, controlled collapse chip connection (C4) bumps, or a combination thereof. In some embodiments, metal posts or metal pillars may further be formed between the redistribution structure RDL and the conductive terminals 170.

Figures 2A, 2B:
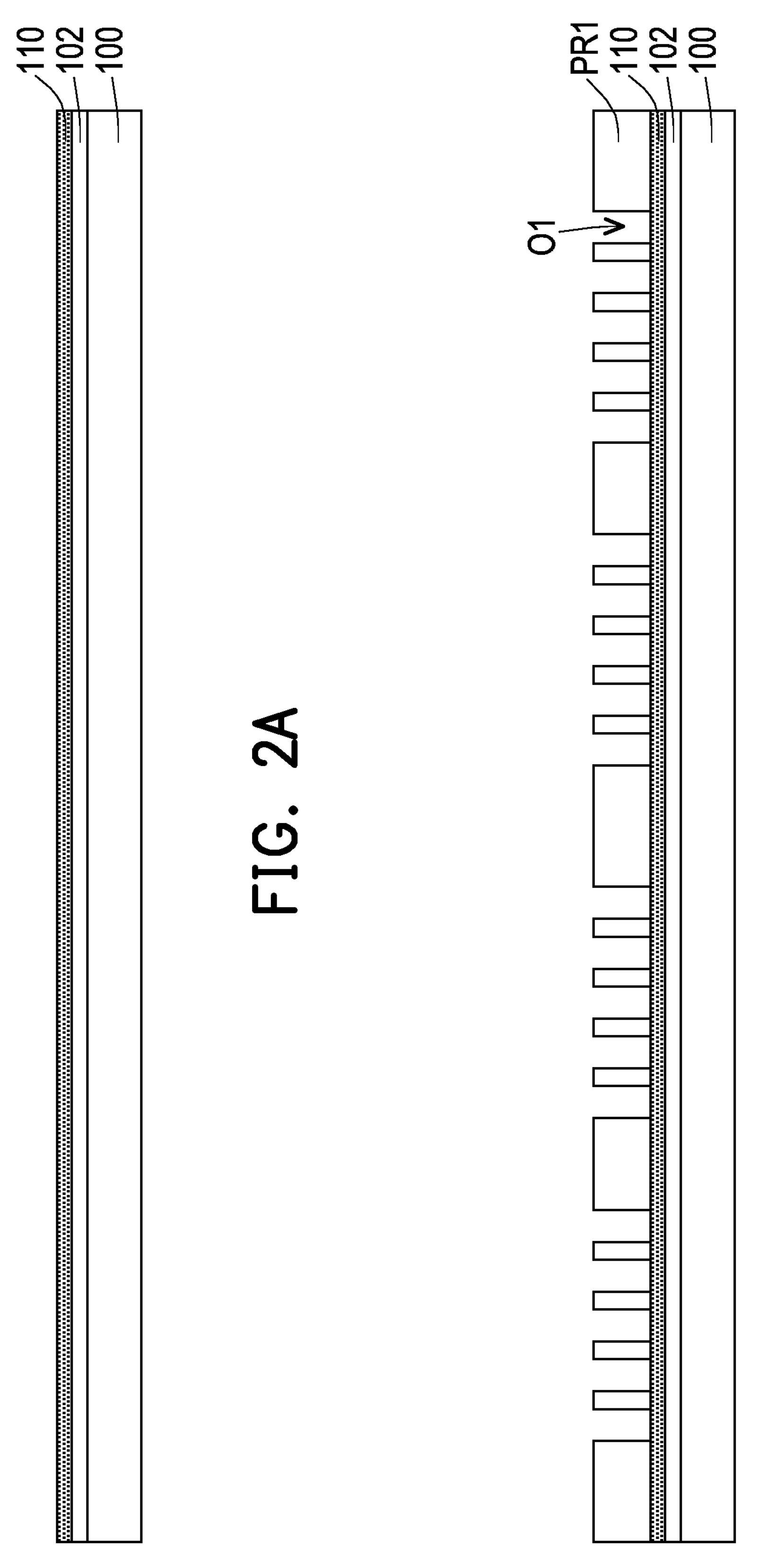
FIGS. 2A to 2L schematically illustrate cross-sectional views of the fabrication method of the package in FIG. 1.

FIGS. 2A to 2L schematically illustrate cross-sectional views of the fabrication method of the package 10 in FIG. 1. Referring to FIG. 2A, a first carrier 100 is provided. The first carrier 100 may be a glass carrier, a wafer, or the like. In some embodiments, the first carrier 100 has a de-bonding layer 102. The de-bonding layer 102 is formed by, for example, a spin coating method. In some embodiments, the de-bonding layer 102 may be formed of an adhesive such as an ultra-violet (UV) glue, a light-to-heat conversion (LTHC) glue, or the like, or other types of adhesives. The de-bonding layer 102 is decomposable under the heat of light to thereby release the first carrier 100 from the overlying structure that will be formed in subsequent steps.

A seed layer 110 is formed above the first carrier 100. In some embodiments, the seed layer 110 is a metal layer, which may be a single layer or a composite layer including a plurality of sub-layers formed of different materials, and is formed by a CVD process or a PVD process, such as sputtering. For example, the seed layer 110 is a titanium/copper composited layer.

Referring to FIG. 2B, a patterned photoresist layer PR1 is formed above the seed layer 110. For example, a photoresist may be formed by spin coating or the like and may be exposed to light for patterning. The patterned photoresist layer PR1 includes openings O1 exposing the seed layer 110.

Figures 2C, 2D:
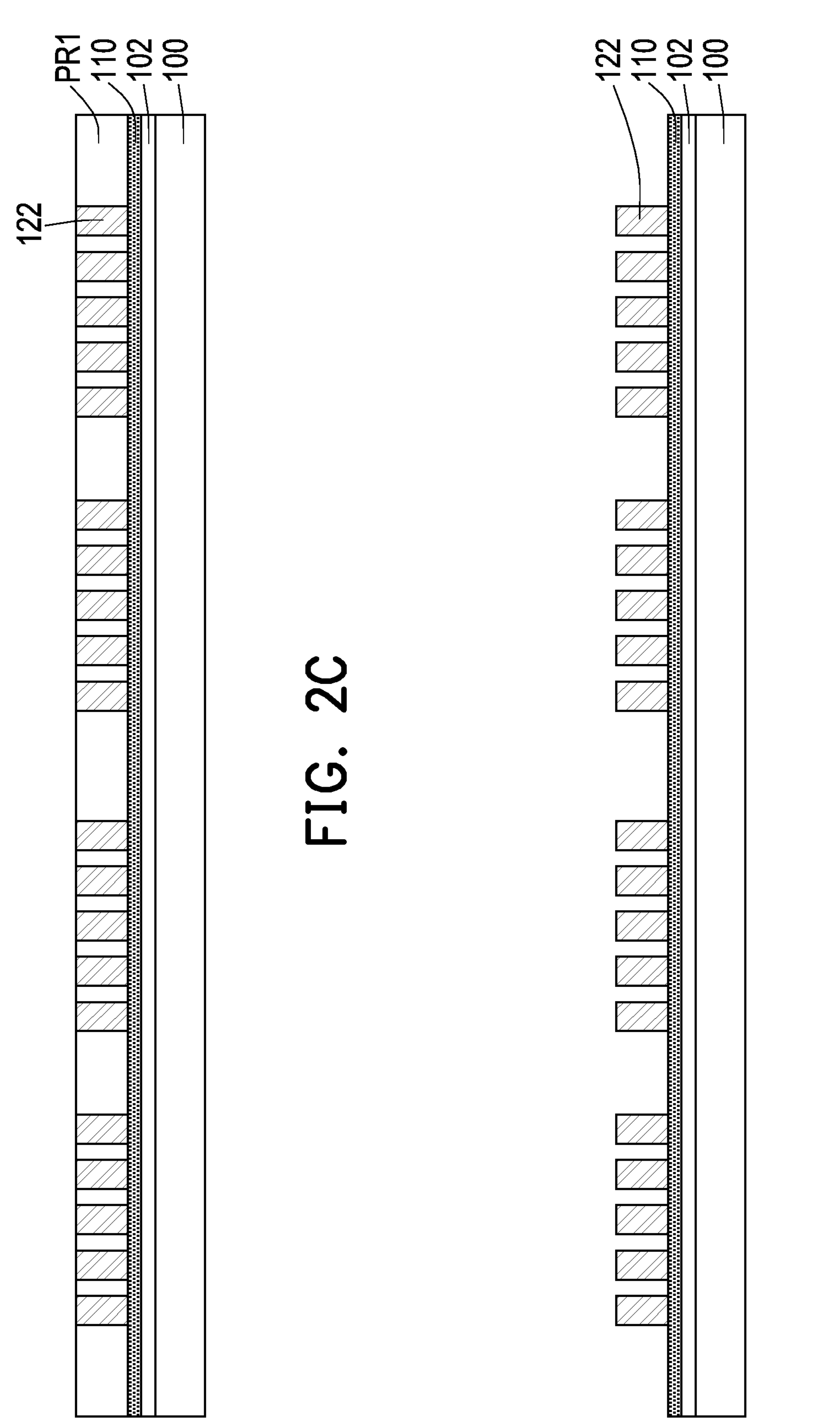

Referring to FIG. 2C, metal layers 122 are formed in the openings O1 by plating, such as electroplating or electroless plating, or the like. The metal layers 122 may include a metal, like copper, titanium, aluminum, gold, nickel, silver, palladium, or the like. In this embodiment, each of the openings O1 is filled with one metal layer 122, but the disclosure is not limited thereto. In other embodiments, each of the openings O1 is filled with more than one metal layers 122 including more than one metal materials.

Figure 2E:
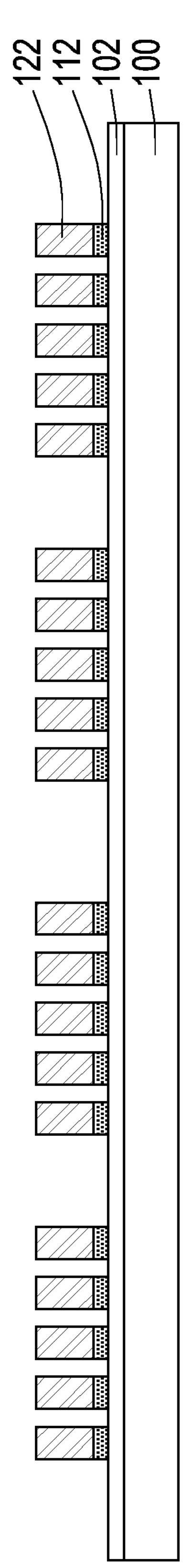

Referring to FIG. 2D, the patterned photoresist layer PR1 is removed by an acceptable ashing or stripping process, such as using an oxygen plasma or the like. Once the patterned photoresist layer PR1 is removed, exposed portions of the seed layer 110 are removed, such as by using an acceptable etching process (e.g., wet or dry etching). The residual seed layers 112 are overlapping with the metal layers 122, as shown in FIG. 2E.

Figure 2F:
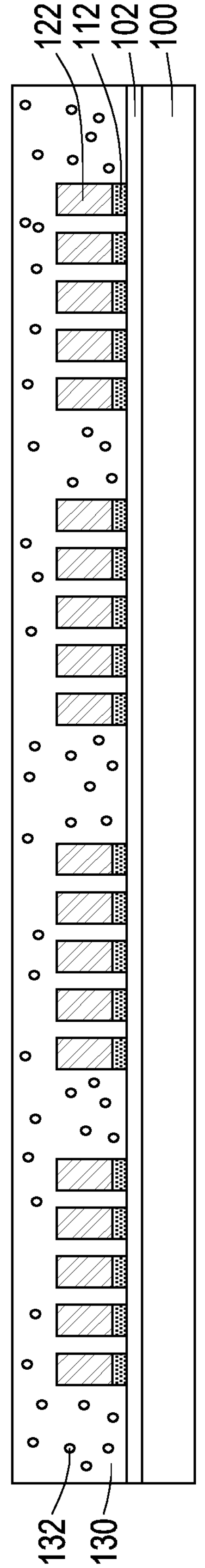

Referring to FIG. 2F, a first molding compound layer 130 with the inorganic fillers 132 is formed above the first carrier 100 and surrounding the metal layers 122 and the residual seed layers 112. In some embodiments, the first molding compound layer 130 may be formed by an over-molding process (e.g., compression molding, or the like). The first molding compound layer 130 covers the top surfaces of the metal layers 122.

Figure 2G:
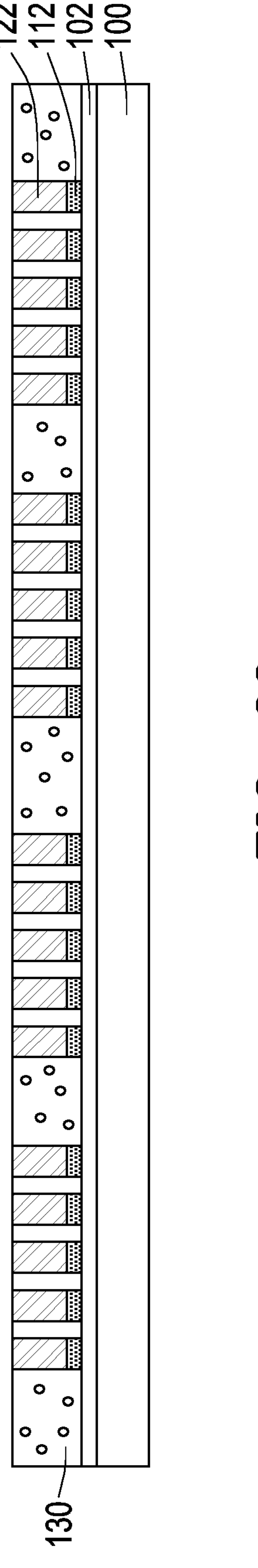

Thereafter, referring to FIG. 2G, the first molding compound layer 130 is ground such that the top surfaces of the metal layers 122 are exposed. In some embodiments, the first molding compound layer 130 is ground by a mechanical grinding process and/or a chemical mechanical polishing (CMP) process. After performing the grinding process, portions of the metal layers 122 may be removed and the metal layers 122 with reduced thickness are formed. As shown in FIG. 2G, in some embodiments, the top surfaces of the metal layers 122 and the top surface of the first molding compound layer 130 are substantially leveled. In some alternative embodiments, the top surface of the first molding compound layer 130 may not level with the top surfaces of metal layers 122. For example, the metal layers 122 may protrude from the top surface of the first molding compound layer 130.

Figure 2H:
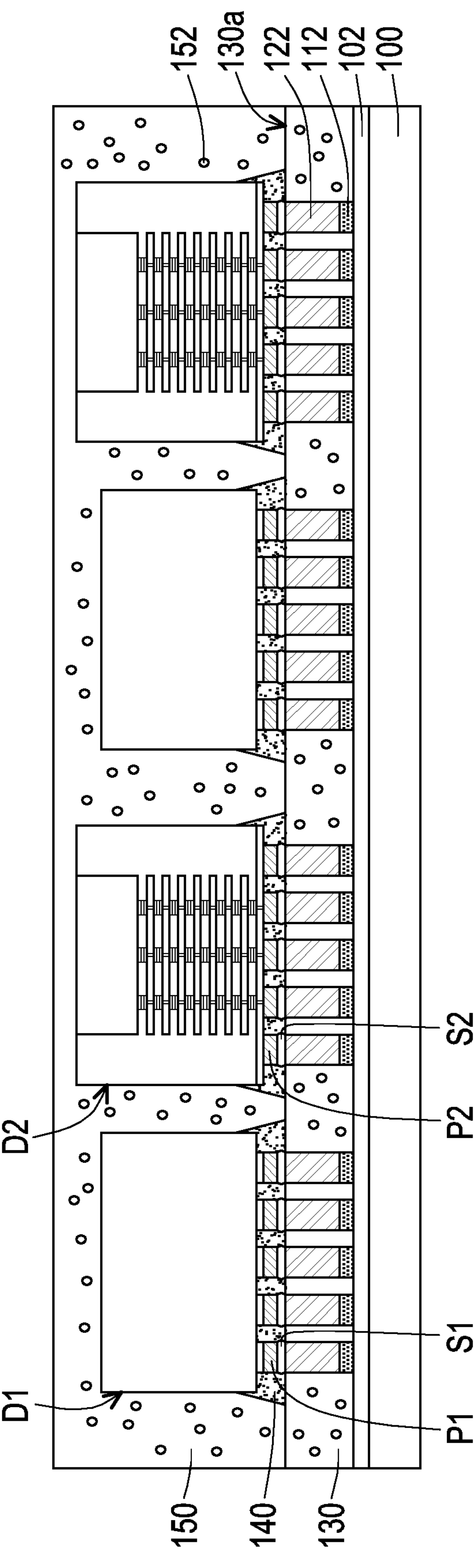

Referring to FIG. 2H, semiconductor devices D1, D2 are provided on the first side 130*a* of the first molding compound layer 130. The semiconductor devices D1, D2 are mounted on the metal layers 122 (or conductive vias in the first molding compound layer 130). For example, the semiconductor devices D1, D2 with die connectors S1, S2 may be placed onto the first molding compound layer 130. Then, the semiconductor devices D1, D2 may be mounted on the metal layers 122 through soldering process. In some embodiments, the soldering process may include a reflow process.

Underfill structures 140 are formed, for example, by capillary underfill filling (CUF) on the first side 130*a* of the first molding compound layer 130. A second molding compound layer 150 with inorganic fillers 152 is formed on the first side 130*a* of the first molding compound layer 130. The semiconductor devices D1, D2 are encapsulated by the second molding compound layer 150. The second molding compound layer 150 may be formed by an over-molding process (e.g., compression molding, or the like).

Figure 2I:
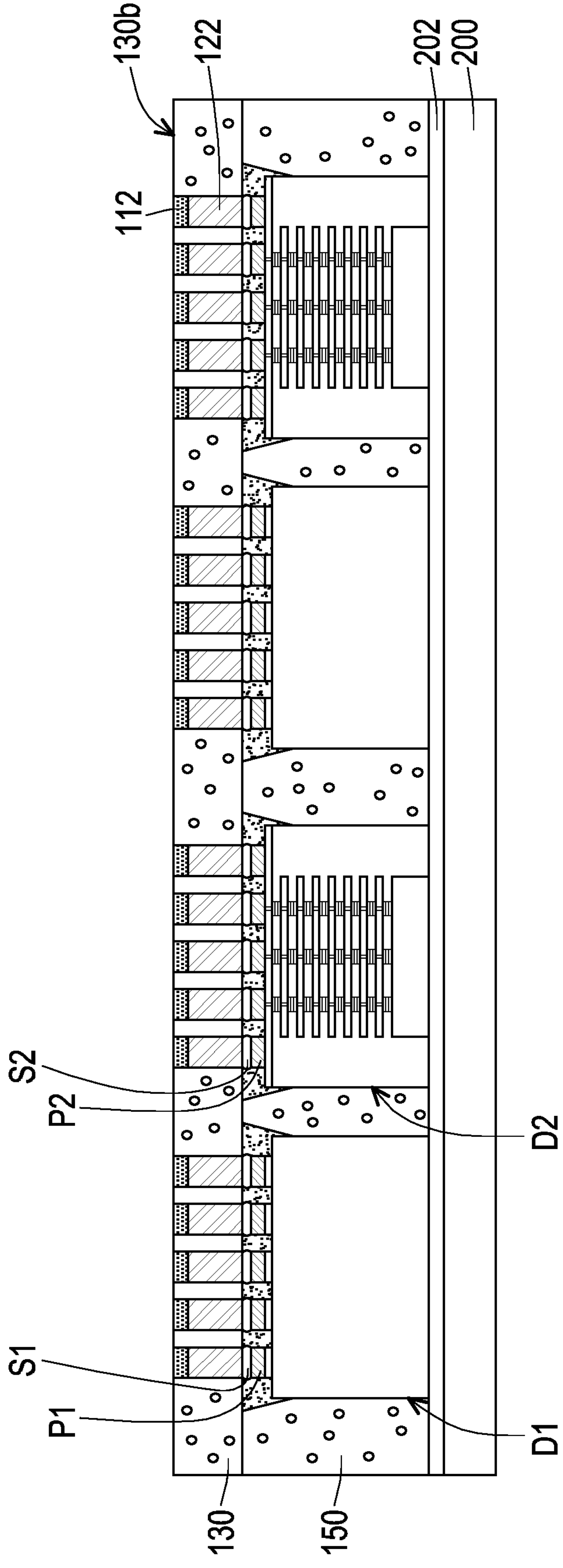

Referring to FIG. 2I, the structure overlying the first carrier 100 is flipped and attached to a second carrier 200 having a de-bonding layer 202, and the first carrier 100 is removed. The second molding compound layer 150 is attached to a second carrier 200. In some embodiments, before the structure is attached to a second carrier 200, the second molding compound layer 150 may be ground by a mechanical grinding process and/or a chemical mechanical polishing (CMP) process. After performing the grinding process, portions of the second molding compound layer 150 may be removed and the semiconductor devices D1, D2 are exposed. In some embodiments, portions of the semiconductor devices D1, D2 are also removed by the grinding process and the semiconductor devices D1, D2 with reduced thickness are formed. In some alternative embodiments, the grinding process of the second molding compound layer 150 may be omitted.

Figure 2J:
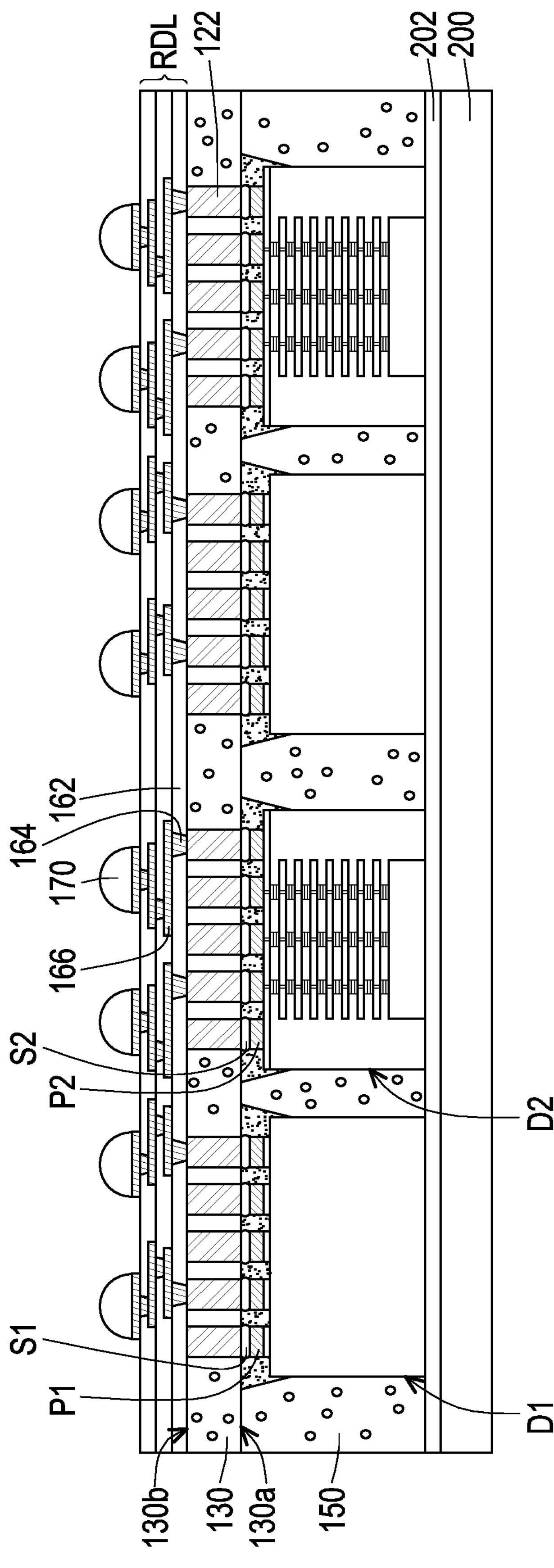

Referring to FIG. 2J, a redistribution structure RDL is formed on a second side 130*b* of the first molding compound layer 130. The semiconductor devices D1, D2 are electrically connected to the redistribution structure RDL through the conductive vias 120 in the first molding compound layer 130. In some embodiments, before forming the redistribution structure RDL, a grinding process is performed on the second side 130*b* of the first molding compound layer 130. A portion of the first molding compound layer 130 and the residual seed layers 112 are removed by the grinding process. In some embodiments, portions of the metal layers 122 may also be removed by the grinding process.

The conductive terminals 170 are formed on the redistribution structure RDL by a suitable process such as evaporation, plating, ball dropping, screen printing and reflow process, a ball mounting process or a C4 process.

Figure 2K:
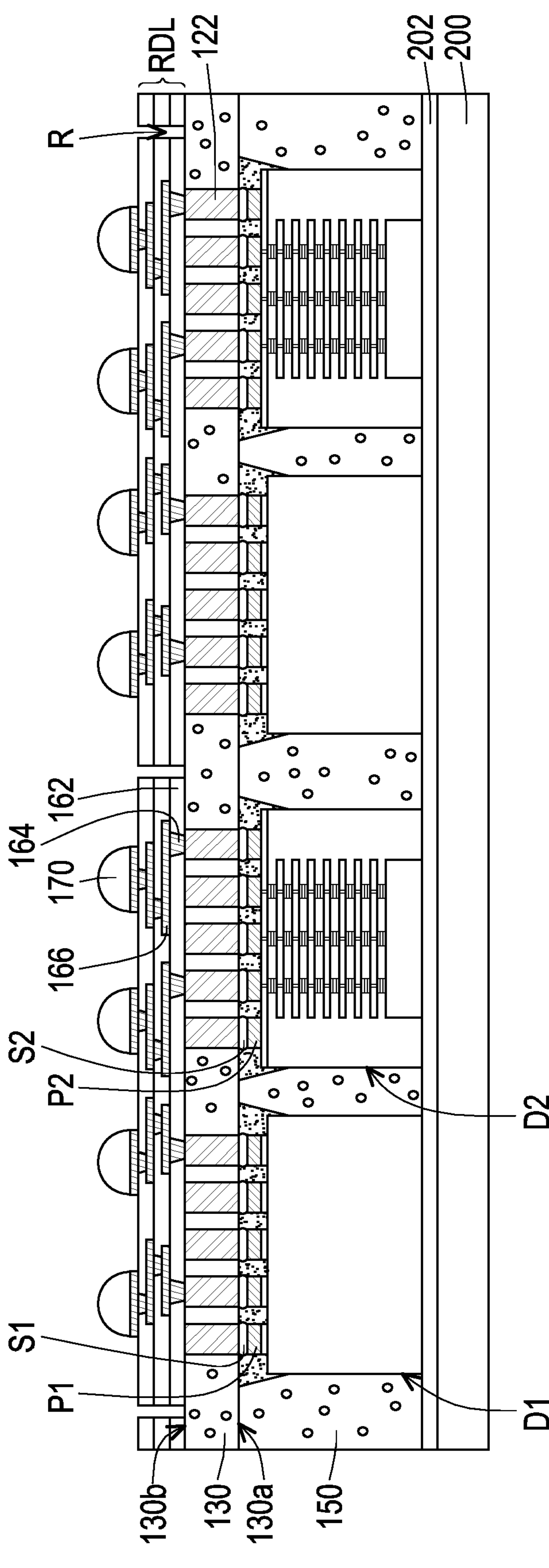

Referring to FIG. 2K, a pre-cutting process is performed on the redistribution structure RDL. For example, the pre-cutting process cut through at least the redistribution structure RDL to form recesses R in the redistribution structure RDL. The pre-cutting process may, for example, include laser cut, or the like. Due to the pre-cutting process, the packages interconnected therebetween are partially diced by the recesses R.

Figure 2L:
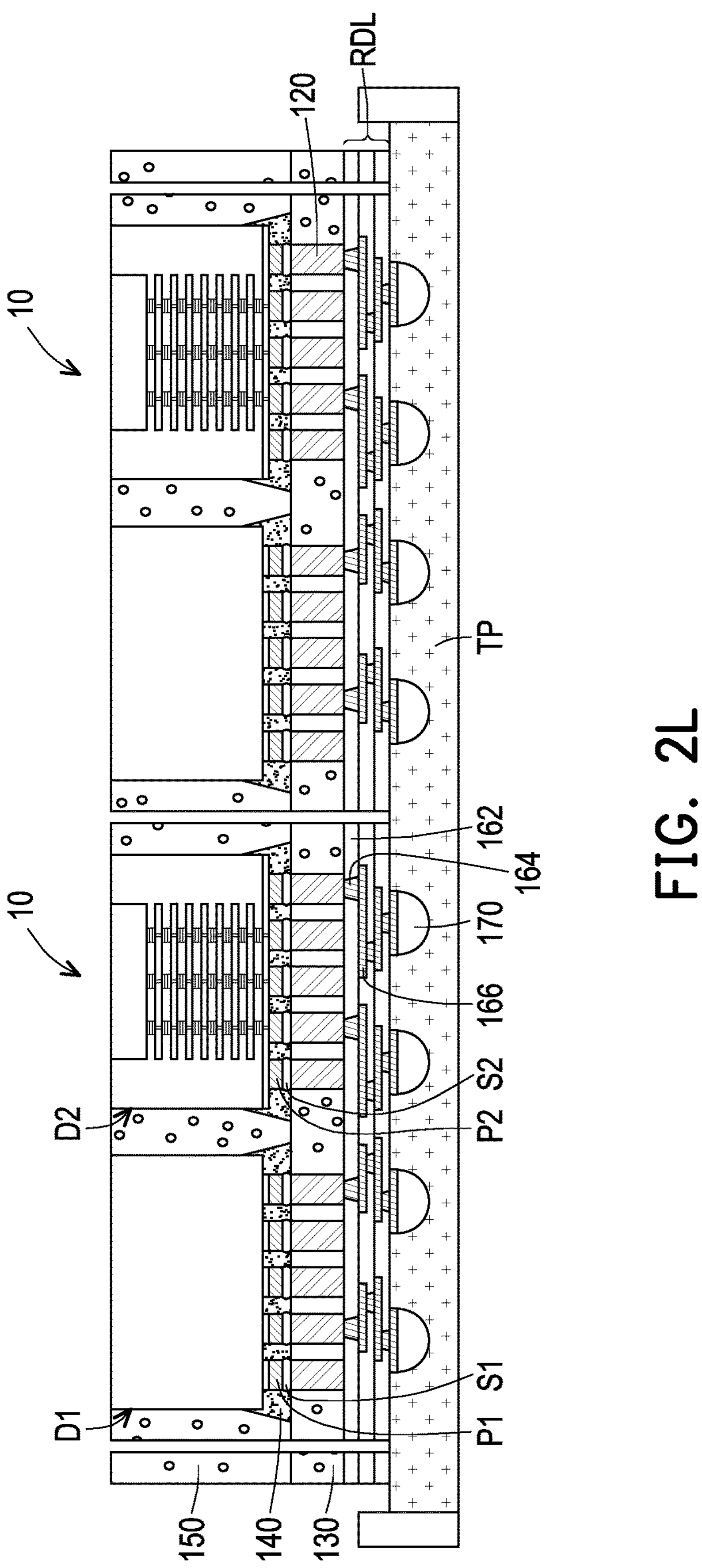

Referring to FIG. 2L, the structure overlying the second carrier 200 is flipped and attached to a tape TP, and the second carrier 200 is removed. A singulation process is performed on the second molding compound layer 150 and the first molding compound layer 130 to separate the packages 10 from one another. The singulation process may be performed by, for example, mechanical blade sawing or laser cutting. In this embodiment, the pre-cutting is performed to cut the redistribution structure RDL before the singulation process. Therefore, the redistribution structure RDL doesn't need to be cut in the singulation process, and the burr problem of the redistribution structure RDL can be avoided.

Figure 3:
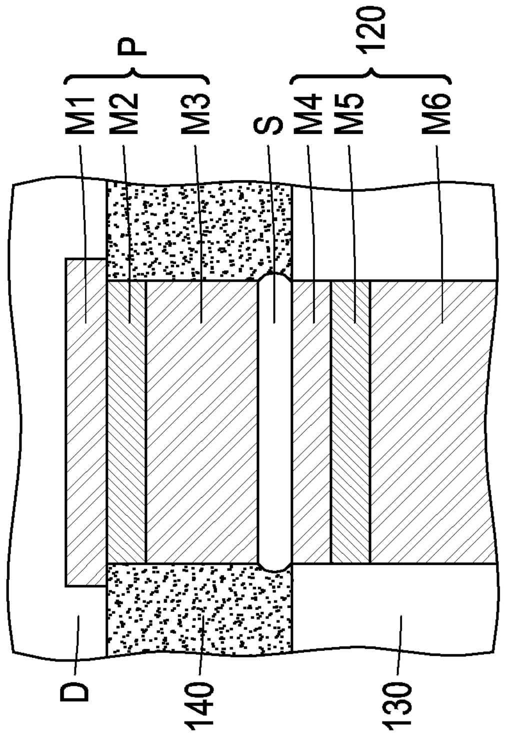
FIG. 3 is a cross-sectional view of the connection between the conductive via and the semiconductor device in the package in accordance with various embodiments of the present disclosure.

FIG. 3 is a cross-sectional view of the connection between the conductive via 120 and the semiconductor device D in the package in accordance with various embodiments of the present disclosure. It should be noted herein that, in embodiments provided in FIG. 3, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 3, the semiconductor device D is mounted on the conductive via 120. A connection structure P of the semiconductor device D is electrically connected to the conductive via 120 through a die connector S. The connection structure P has a multilayer structure and includes a first metal layer M1, a second metal layer M2 and a third metal layer M3 that are sequentially connected. The conductive via 120 has a multilayer structure and includes a fourth metal layer M4, a fifth metal layer M5 and a sixth metal layer M6 that are sequentially connected. In some embodiments, the uppermost metal layer M4 of the conductive via 120 may be a seed layer, and the metal layer M5 and a sixth metal layer M6 may be formed on the seed layer by plating processes, but the invention is not limited thereto. In some alternately embodiments, both of the fourth metal layer M4, the fifth metal layer M5 and the sixth metal layer M6 are formed by plating process. That is, the method of forming the conductive via may include performing more than one plating process in the opening of the patterned photoresist layer (referring to FIG. 2C).

The third metal layer M3 and the fourth metal layer M4 are respectively connected to opposite sides of the die connector S. In some embodiments, the third metal layer M3 and the fourth metal layer M4 are made of a same material (e.g., Cu), the second metal layer M2 and the fifth metal layer M5 are made of a same material (e.g., Ni), and the first metal layer M1 and the sixth metal layer M6 are made of a same material (e.g., Cu). That is, the materials of the metal layers are arranged symmetrically on both sides of the die connector S, thereby improving the conductive properties between the semiconductor device D and the conductive via 120.

Figure 4:
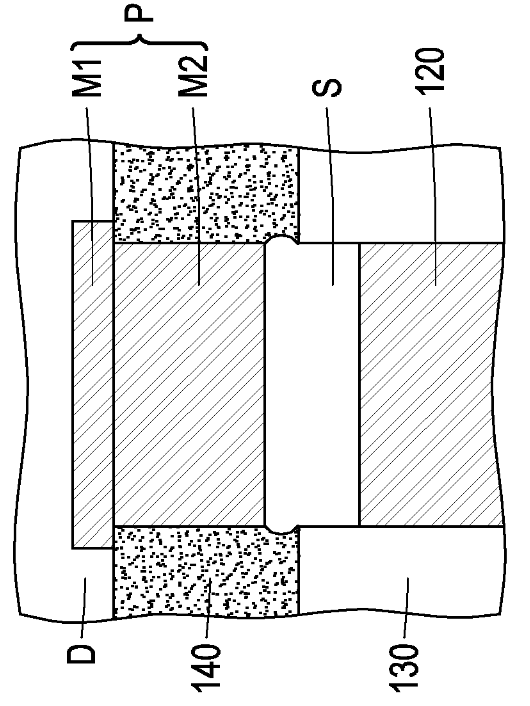
FIG. 4 is a cross-sectional view of the connection between the conductive via and the semiconductor device in the package in accordance with various embodiments of the present disclosure.

FIG. 4 is a cross-sectional view of the connection between the conductive via 120 and the semiconductor device D in the package in accordance with various embodiments of the present disclosure. It should be noted herein that, in embodiments provided in FIG. 4, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 4, the semiconductor device D is mounted on the conductive via 120. A connection structure P of the semiconductor device D is electrically connected to the conductive via 120 through a die connector S. The connection structure P has a multilayer structure and includes a first metal layer M1 and a second metal layer M2.

In this embodiment, an etching back process is performed on the conductive via 120 after grinding the first molding compound layer 130 (referring to FIG. 2G). Therefore, the top surface of the conductive via 120 is lower than a top surface of first molding compound layer 130. The semiconductor device D is placed onto the conductive via 120, and at least a portion of the die connector S is embedded in the first molding compound layer 130, thereby reducing the probability of the semiconductor device D being offset from the conductive via 120.

Figure 5:
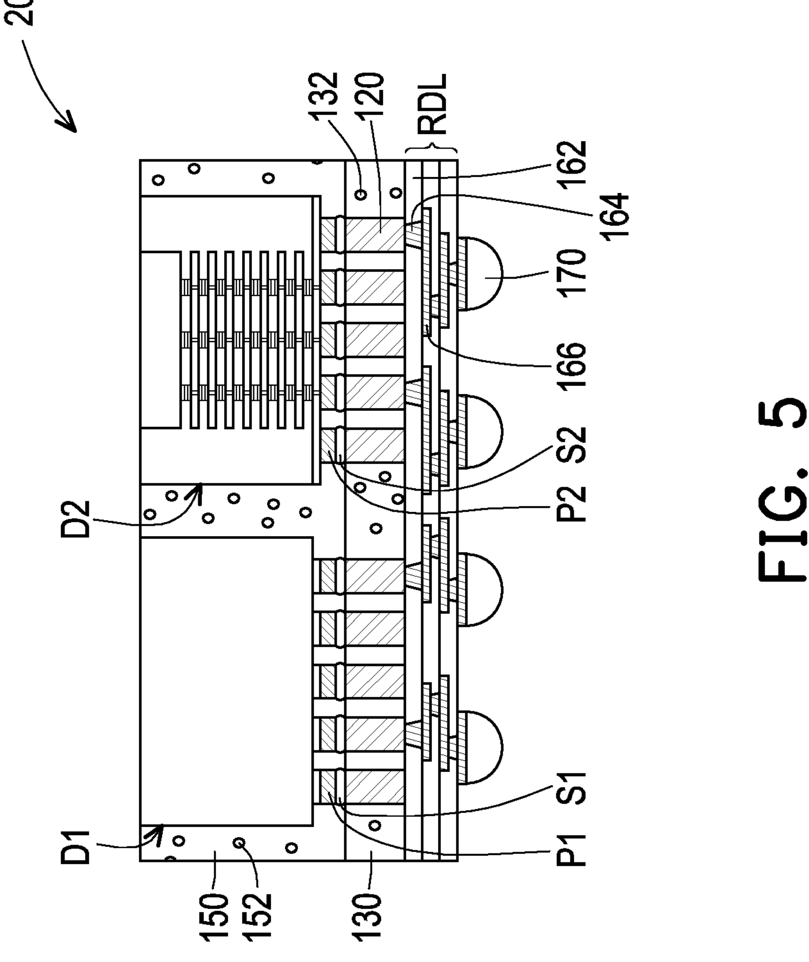
FIG. 5 is a cross-sectional view of the package in accordance with various embodiments of the present disclosure.

FIG. 5 is a cross-sectional view of the package 20 in accordance with various embodiments of the present disclosure. It should be noted herein that, in embodiments provided in FIG. 5, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The difference between the package 20 of FIG. 5 and the package 10 of FIG. 1 is that: the package 20 doesn't have the underfill structures surrounding the die connectors S1, S2. In FIG. 5, the second molding compound layer 150 is formed by the molding underfill (MUF) process, and the die connectors S1, S2 are surrounded by the second molding compound layer 150. The second molding compound layer 150 not only fill up the interstices between the die connectors S1, S2 for securing the connectors S1, S2, but also fill into the gaps between the semiconductor devices D1, D2.

Figure 6:
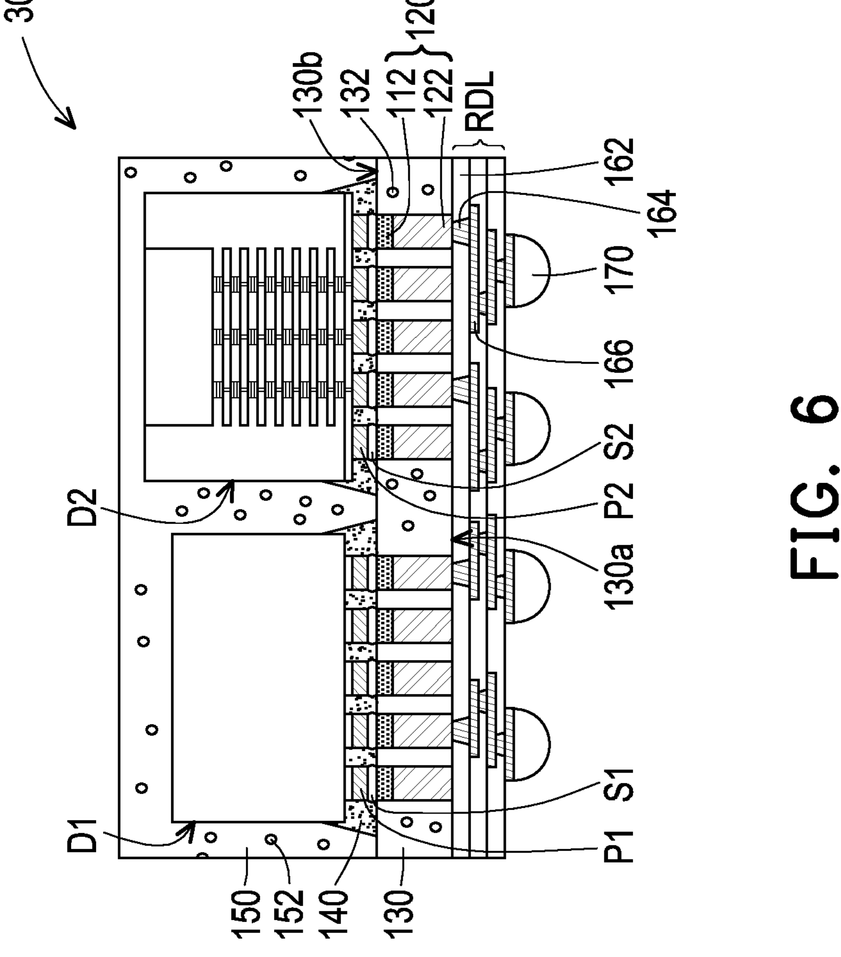
FIG. 6 is a cross-sectional view of the package in accordance with various embodiments of the present disclosure.

FIG. 6 is a cross-sectional view of the package 30 in accordance with various embodiments of the present disclosure. It should be noted herein that, in embodiments provided in FIG. 6, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 6, each of the conductive vias 120 includes a residual seed layer 112 and a metal layer 122 formed thereon. The metal layers 122 are located at the first side 130*a* of the first molding compound layer 130, and the residual seed layers 112 are located at the second side 130*b* of the first molding compound layer 130. In addition, the second molding compound layer 150 covers the top surfaces of the semiconductor devices D1, D2 in the package 30 of FIG. 6.

FIGS. 7A to 7E schematically illustrate cross-sectional views of the fabrication method of the package in FIG. 6. Proceeding from FIG. 1G and now to FIG. 7A, a redistribution structure RDL is formed on the first side 130*a* of the first molding compound layer 130. The redistribution structure RDL is electrically connected with the metal layers 122. In some embodiments, a grinding process is performed on the first side 130*a* of the first molding compound layer 130 before forming the redistribution structure RDL. The grinding process may remove a portion of the first molding compound layer 130 and a portion of the metal layers 122.

The conductive terminals 170 are formed on the redistribution structure RDL by a suitable process such as evaporation, plating, ball dropping, screen printing and reflow process, a ball mounting process or a C4 process.

Figure 7A:
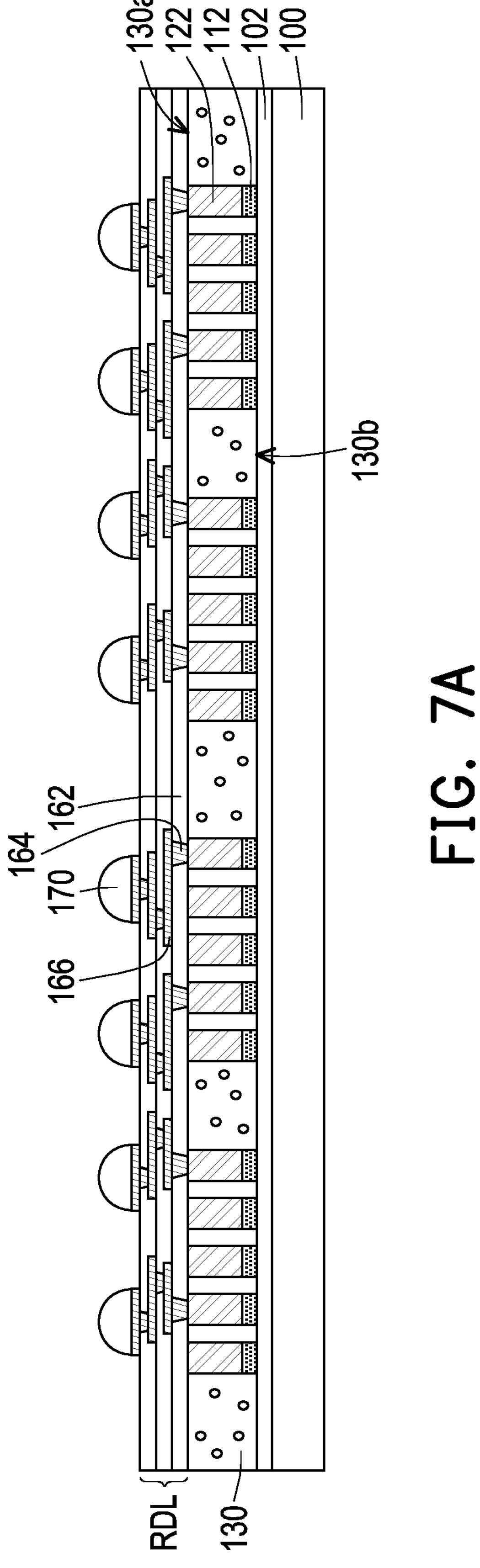
FIGS. 7A to 7E schematically illustrate cross-sectional views of the fabrication method of the package in FIG. 6.
Figure 7B:
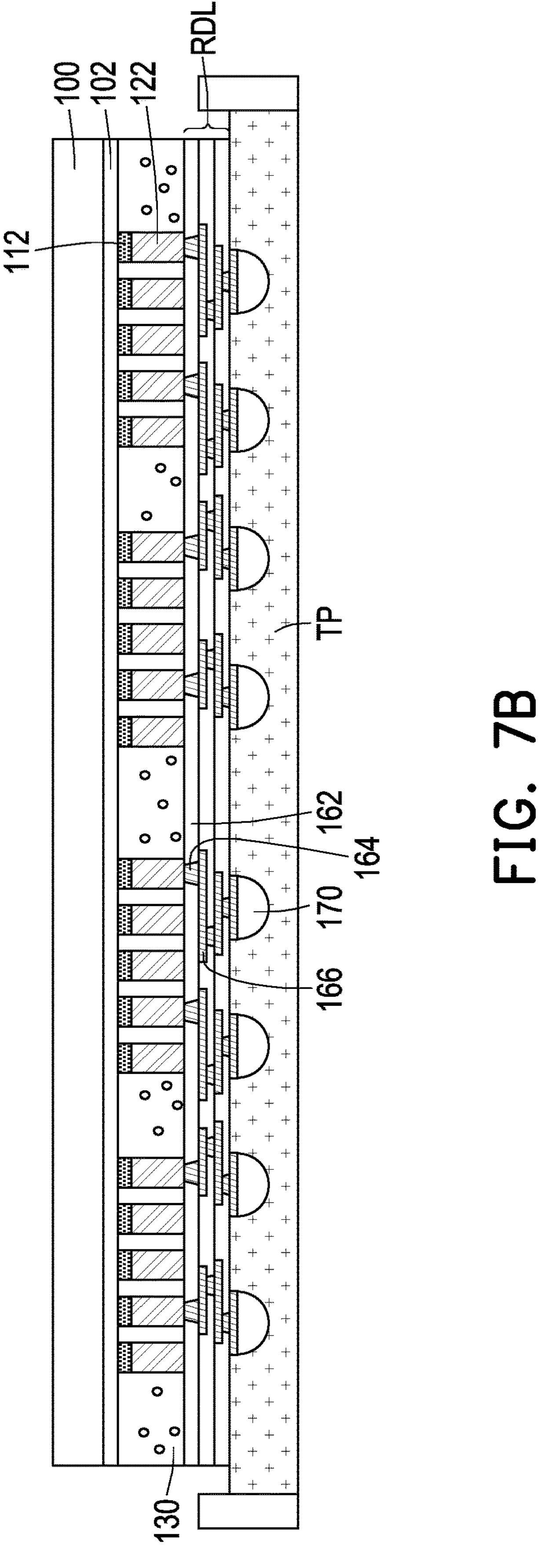

Referring to FIG. 7B, the structure overlying the first carrier 100 is flipped and attached to a tape TP. The conductive terminal is mounted to the tape TP. Then, the first carrier 100 is removed, as shown in FIG. 7C.

Figure 7C:
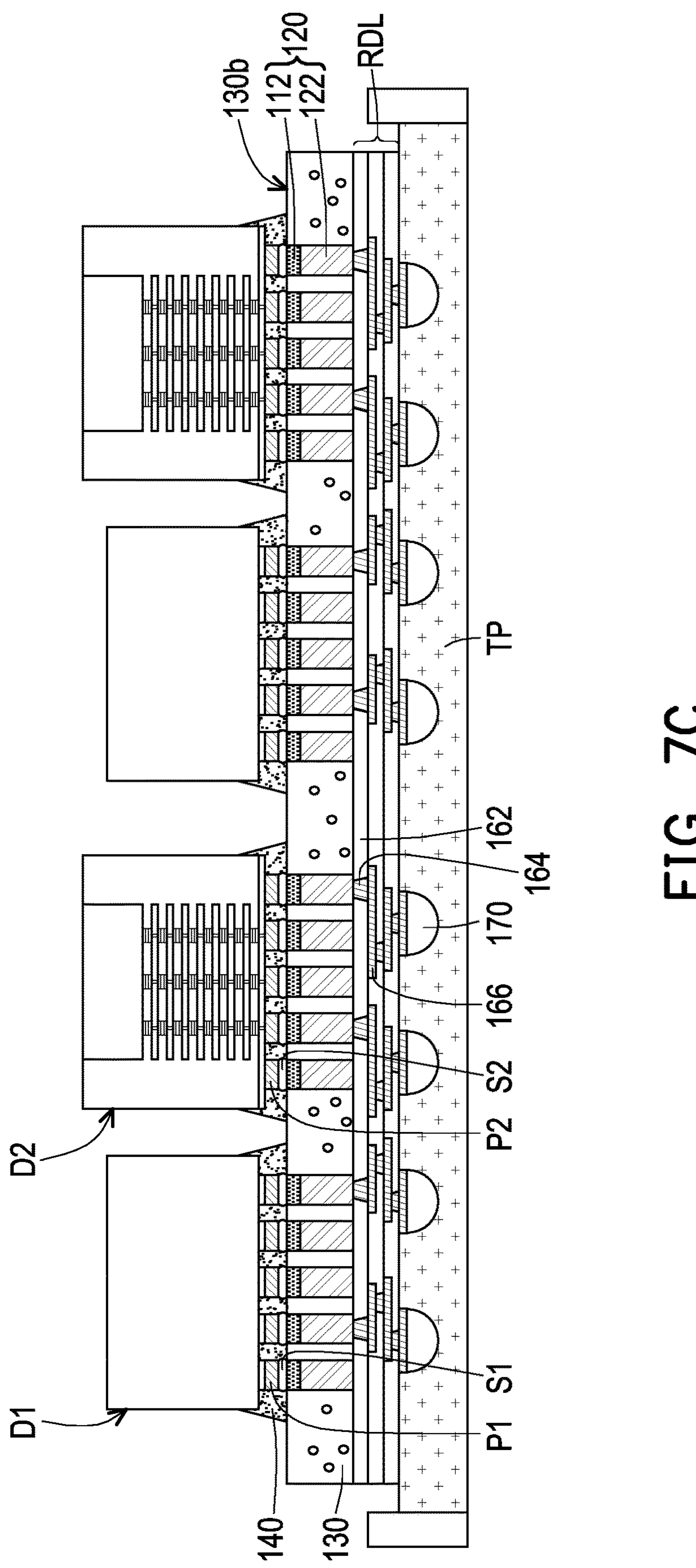

Continued on FIG. 7C, semiconductor devices D1, D2 are provided on the second side 130*b* of the first molding compound layer 130. The semiconductor devices D1, D2 are mounted on the residual seed layers 112 (or conductive via 120 in the first molding compound layer 130). For example, the semiconductor devices D1, D2 with die connectors S1, S2 may be placed on the first molding compound layer 130. Then, the semiconductor devices D1, D2 may be mounted on the residual seed layers 112 through soldering process. In some embodiments, the soldering process may include a reflow process. The semiconductor devices D1, D2 are electrically connected to the redistribution structure RDL through the conductive via 120.

Underfill structures 140 are formed, for example, by capillary underfill filling (CUF) on the second side 130*b* of the first molding compound layer 130.

Figure 7D:
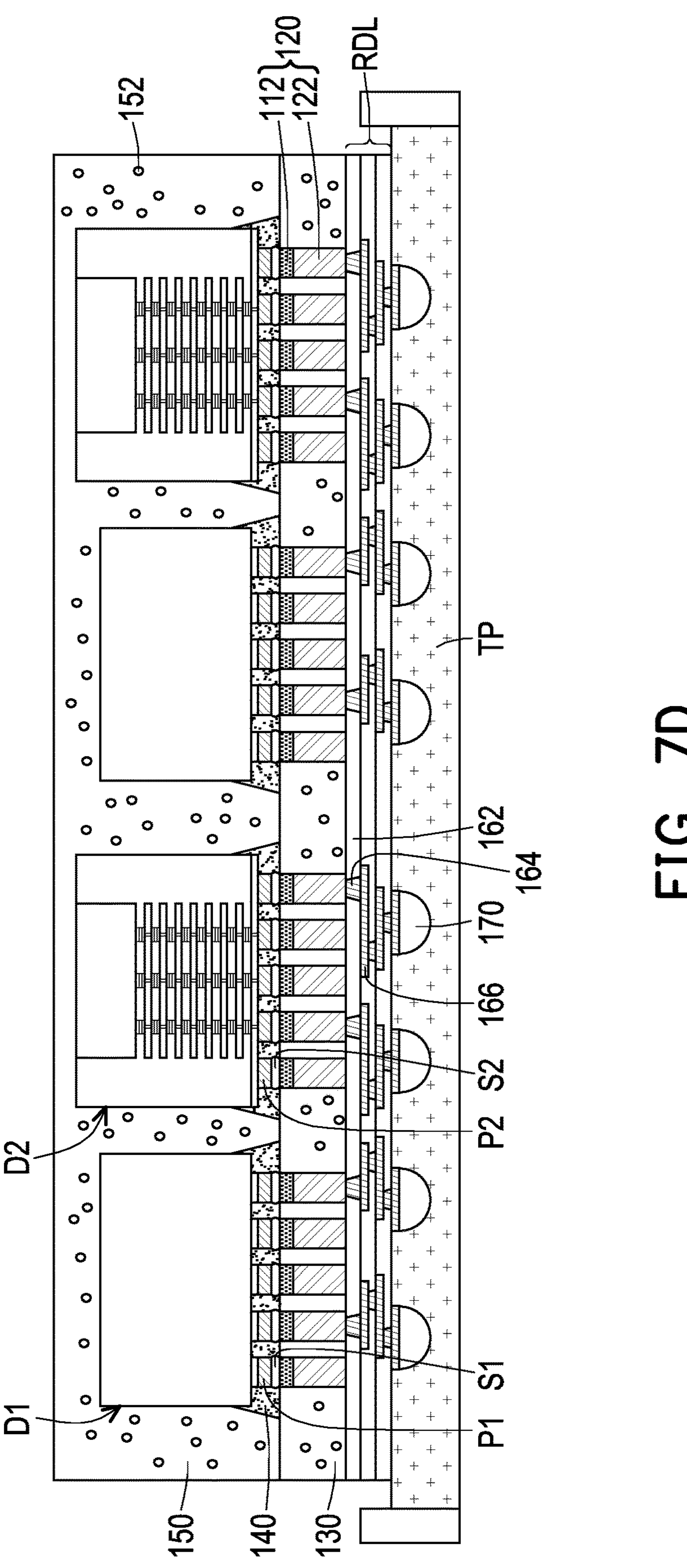

Referring to FIG. 7D, a second molding compound layer 150 with inorganic fillers 152 is formed on the second side 130*b* of the first molding compound layer 130. The semiconductor devices D1, D2 are encapsulated by the second molding compound layer 150. The second molding compound layer 150 may be formed by an over-molding process (e.g., compression molding, or the like).

Figure 7E:
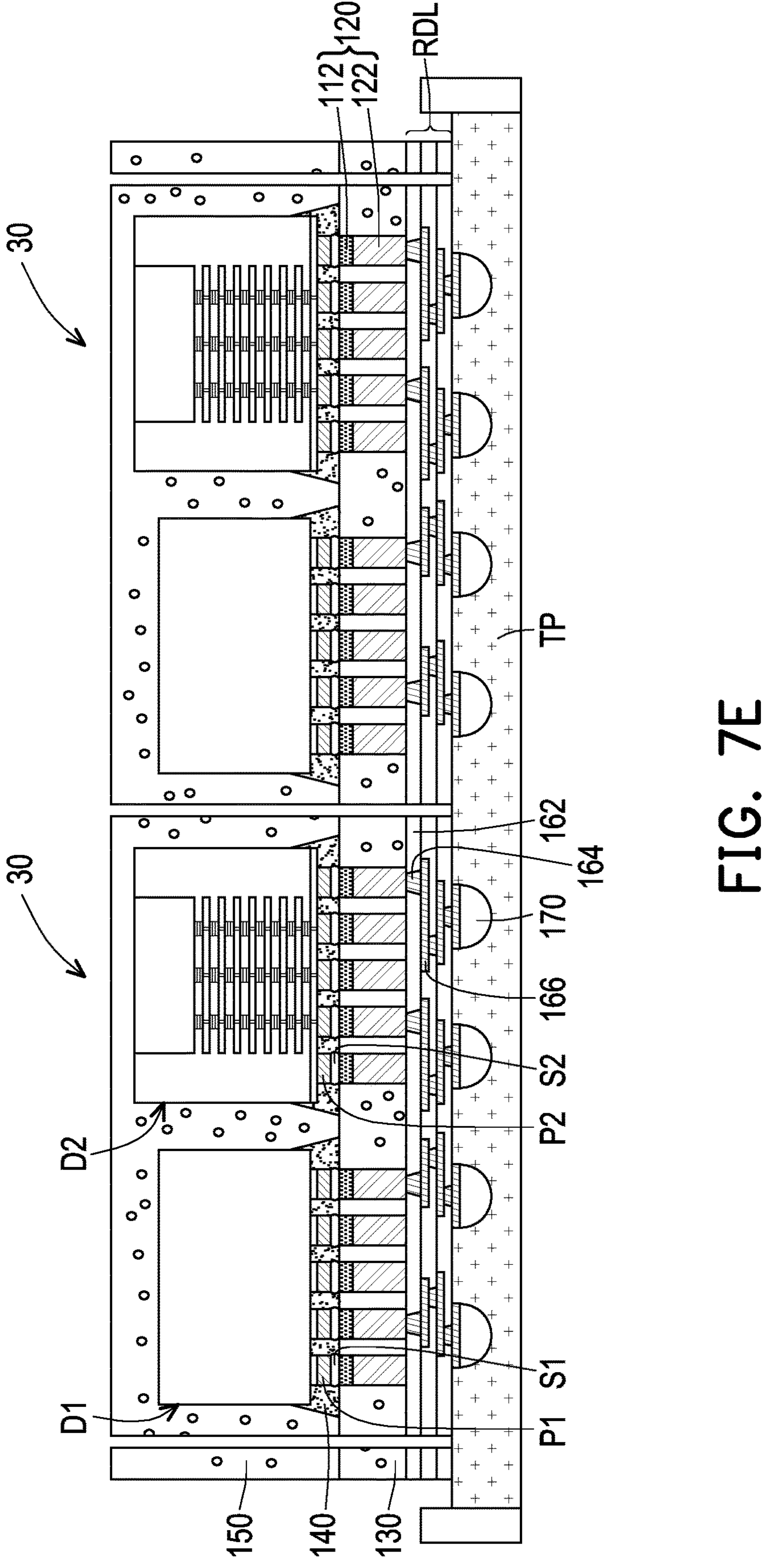

Referring to FIG. 7E, a singulation process is performed on the second molding compound layer 150, the first molding compound layer 130 and the redistribution structure RDL to separate the packages 30 from one another. The singulation process may be performed by, for example, mechanical blade sawing or laser cutting.

Figure 8:
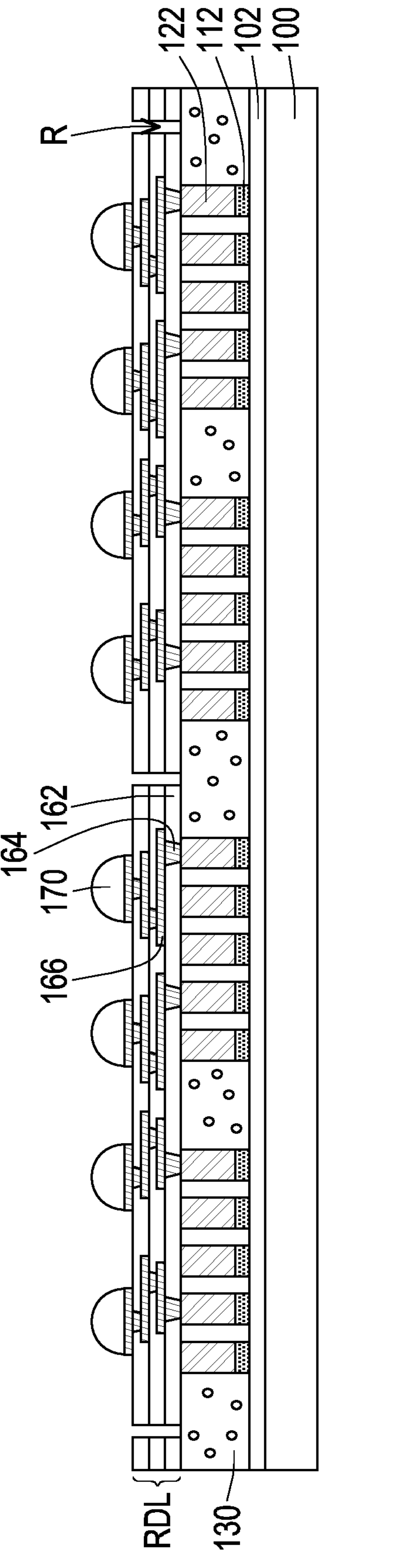
FIG. 8 schematically illustrates cross-sectional view of the fabrication method in accordance with various embodiments of the present disclosure.

FIG. 8 schematically illustrates cross-sectional view of the fabrication method in accordance with various embodiments of the present disclosure. It should be noted herein that, in embodiments provided in FIG. 8, element numerals and partial content of the embodiments provided in FIG. 6 are followed, the same or similar reference numerals being used to represent the same or similar elements, and description of the same technical content being omitted. For a description of an omitted part, reference may be made to the foregoing embodiment, and the descriptions thereof are omitted herein.

Proceeding from FIG. 7A and now to FIG. 8, a pre-cutting process is performed on the redistribution structure RDL. For example, the pre-cutting process cut through at least the redistribution structure RDL to form recesses R in the redistribution structure RDL. The pre-cutting process may, for example, include laser cut, or the like. Due to the pre-cutting process, the packages interconnected therebetween are partially diced by the recesses R.

After the pre-cutting process, the steps described in FIGS. 7B to 7E are performed to form the package 30 shown in FIG. 6. In the embodiment of FIG. 8, the redistribution structure RDL doesn't need to be cut in the singulation process, thereby reducing the burr problem of the redistribution structure RDL.

In accordance with some embodiments, a package includes a first molding compound layer, a conductive via embedded in the first molding compound layer, a semiconductor device, a redistribution structure and a second molding compound layer. The semiconductor device and the redistribution structure are respectively disposed on opposite sides of the first molding compound layer, wherein the semiconductor device is electrically connected to the redistribution structure through the conductive via. The second molding compound layer is disposed on the first molding compound layer, wherein the semiconductor device is encapsulated by the second molding compound layer.

In accordance with some embodiments, a method of fabrication a package comprises: forming a first molding compound layer and a conductive via embedded in the first molding compound layer above a first carrier; providing a semiconductor device and a second molding compound layer on a first side of the first molding compound layer, wherein the semiconductor device is encapsulated by the second molding compound layer; removing the first carrier; and forming a redistribution structure on a second side of the first molding compound layer opposite to the first side, wherein the semiconductor device is electrically connected to the redistribution structure through the conductive via.

In accordance with some embodiments, a method of fabrication a package comprises: forming a first molding compound layer and a conductive via embedded in the first molding compound layer above a first carrier; forming a redistribution structure on a first side of the first molding compound layer; removing the first carrier; and providing a semiconductor device and a second molding compound layer on a second side of the first molding compound layer opposite to the first side, wherein the semiconductor device is encapsulated by the second molding compound layer, wherein the semiconductor device is electrically connected to the redistribution structure through the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

What is claimed is:

1. A package, comprising:

a first molding compound layer and a conductive via embedded in the first molding compound layer;

a semiconductor device and a redistribution structure respectively disposed on opposite sides of the first molding compound layer, wherein the semiconductor device is electrically connected to the redistribution structure through the conductive via; and a second molding compound layer disposed on the first molding compound layer, wherein the semiconductor device is encapsulated by the second molding compound layer, wherein a first connection structure of the semiconductor device is electrically connected to the conductive via through a die connector, the first connection structure comprises a first metal layer, a second metal layer and a third metal layer that are sequentially connected, and the conductive via comprises a fourth metal layer, a fifth metal layer and a sixth metal layer that are sequentially connected, wherein the third metal layer and the fourth metal layer are respectively connected to opposite sides of the die connector, the third metal layer and the fourth metal layer are made of a same material, the second metal layer and the fifth metal layer are made of a same material, and the first metal layer and the sixth metal layer are made of a same material.

2. The package according to claim 1, wherein the die connector comprises solder.

3. The package according to claim 1, wherein the third metal layer and the fourth metal layer are made of copper, the second metal layer and the fifth metal layer are made of nickel, and the first metal layer and the sixth metal layer are made of copper.

4. The package according to claim 3, wherein a first side of the first molding compound layer is in contact with a bottom surface of the second molding compound layer, a second side of the first molding compound layer is in contact with a top surface of the redistribution structure.

5. The package according to claim 1, wherein the first molding compound layer comprises a polymer and inorganic fillers dispersed in the polymer.

6. The package according to claim 1, wherein the redistribution structure comprises an insulating layer and a redistribution layer, wherein the Young's modulus of the first molding compound layer is larger than the Young's modulus of the insulating layer.

7. A method of fabrication a package, comprising:

forming a first molding compound layer and a conductive via embedded in the first molding compound layer above a first carrier;

providing a semiconductor device and a second molding compound layer on a first side of the first molding compound layer, wherein the semiconductor device is encapsulated by the second molding compound layer, and a first connection structure of the semiconductor device is electrically connected to the conductive via through a die connector, the first connection structure comprises a first metal layer, a second metal layer and a third metal layer that are sequentially connected, and the conductive via comprises a fourth metal layer, a fifth metal layer and a sixth metal layer that are sequentially connected, wherein the third metal layer and the fourth metal layer are respectively connected to opposite sides of the die connector, the third metal layer and the fourth metal layer are made of a same material, the second metal layer and the fifth metal layer are made of a same material, and the first metal layer and the sixth metal layer are made of a same material;

removing the first carrier; and forming a redistribution structure on a second side of the first molding compound layer opposite to the first side, wherein the semiconductor device is electrically connected to the redistribution structure through the conductive via.

8. The method according to claim 7, wherein the method of forming the first molding compound layer and the conductive via comprises:

forming a seed layer above the first carrier;

forming a patterned photoresist layer above the seed layer, wherein the patterned photoresist layer comprises an opening exposing the seed layer;

forming a metal layer in the opening;

removing the photoresist layer;

removing exposed portions of the seed layer; and forming the first molding compound layer above the first carrier and surrounding the metal layer and a residual seed layer, wherein the conductive via comprises at least the metal layer.

9. The method according to claim 8, wherein the method of forming the conductive via comprises:

performing more than one plating process in the opening, wherein the conductive via has a multilayer structure.

10. The method according to claim 7, further comprises:

attaching the second molding compound layer to a second carrier;

performing a pre-cutting process on the redistribution structure;

removing the second carrier; and performing a singulation process on the second molding compound layer and the first molding compound layer.

11. The method according to claim 7, further comprises:

performing an etching back process on the conductive via, wherein a top surface of the conductive via is lower than a top surface of the first molding compound layer after the etching back process.

12. The method according to claim 7, further comprises:

performing a grinding process on the second side of the first molding compound layer before forming the redistribution structure.

13. A package, comprising:

a first molding compound layer with inorganic fillers dispersed therein;

conductive vias, embedded in the first molding compound layer, wherein the conductive vias extend from a first side of the first molding compound layer to a second side of the first molding compound layer, wherein the inorganic fillers of the first molding compound layer surround the conductive vias;

semiconductor devices, disposed on the first side of the first molding compound layer and electrically connected to the conductive vias through die connectors, wherein the die connectors comprise solder, wherein a portion of the die connectors is embedded in the first molding compound layer, and an interface between the portion of the die connectors and the conductive vias is surrounded by the first molding compound layer; and a redistribution structure, disposed on the second side of the first molding compound layer and in directly contact with the conductive vias.

14. The package according to claim 13, wherein another portion of the die connectors is surrounded by an underfill structure.

15. The package according to claim 13, further comprises:

a second molding compound layer disposed on the first molding compound layer, wherein the semiconductor devices are encapsulated by the second molding compound layer, and the first molding compound layer and the second molding compound layer comprise a same material.

16. The package according to claim 13, further comprises:

a second molding compound layer disposed on the first molding compound layer, wherein the semiconductor devices are encapsulated by the second molding compound layer, and the first molding compound layer is in contact with the second molding compound layer.

17. The package according to claim 13, wherein the first molding compound layer comprises a polymer and the inorganic fillers dispersed in the polymer.

18. The package according to claim 13, wherein the redistribution structure comprises an insulating layer and a redistribution layer, wherein the Young's modulus of the first molding compound layer is larger than the Young's modulus of the insulating layer.

19. The package according to claim 13, wherein the second side of the first molding compound layer and bottom surfaces of the conductive vias are coplanar.

20. The method according to claim 7, wherein the third metal layer and the fourth metal layer are made of copper, the second metal layer and the fifth metal layer are made of nickel, and the first metal layer and the sixth metal layer are made of copper.

* * * * *